United States Patent [19]

Cruz et al.

[11] Patent Number: 5,275,479
[45] Date of Patent: Jan. 4, 1994

[54] SYSTEM OF DOORS BETWEEN TWO MOBILE CONTAINERS, PARTICULARLY TWO ULTRACLEAN CONTAINERS

[75] Inventors: Didier Cruz, Grenoble; Claude Doche, Claix, both of France

[73] Assignee: Commissariat a l'Energie Atomique, France

[21] Appl. No.: 56,580

[22] Filed: Apr. 30, 1993

Related U.S. Application Data

[63] Continuation-in-part of Ser. No. 755,691, Sep. 6, 1991, abandoned.

Foreign Application Priority Data

Sep. 17, 1990 [FR] France ................. 90 11450

[51] Int. Cl.⁵ .............................................. A47B 96/00
[52] U.S. Cl. .......................................... 312/1; 312/296
[58] Field of Search ........................... 312/1, 296, 297

[56] References Cited

U.S. PATENT DOCUMENTS

| | | | |
|---|---|---|---|
| 3,491,720 | 1/1970 | Harris | 312/1 |
| 3,907,389 | 9/1975 | Cox et al. | 312/1 |
| 4,604,111 | 8/1986 | Natale | 312/1 |
| 4,746,256 | 5/1988 | Boyle et al. | |

*Primary Examiner*—Peter R. Brown
*Attorney, Agent, or Firm*—Pearne, Gordon, McCoy & Granger

[57] ABSTRACT

The invention permits the transfer between two containers of an object without the latter being in contact with the atmosphere around the containers. The system comprises two doors (12, 22) joined tightly to one another in such a way that the outer faces (13, 23) of these doors are positioned facing one another during opening, e.g. by winding the same around a drum (21). These doors are constituted by two flexible curtains sliding in lateral carriages. The system is particularly applicable to the production of semiconductor wafers or slices in an ultraclean atmosphere.

6 Claims, 4 Drawing Sheets

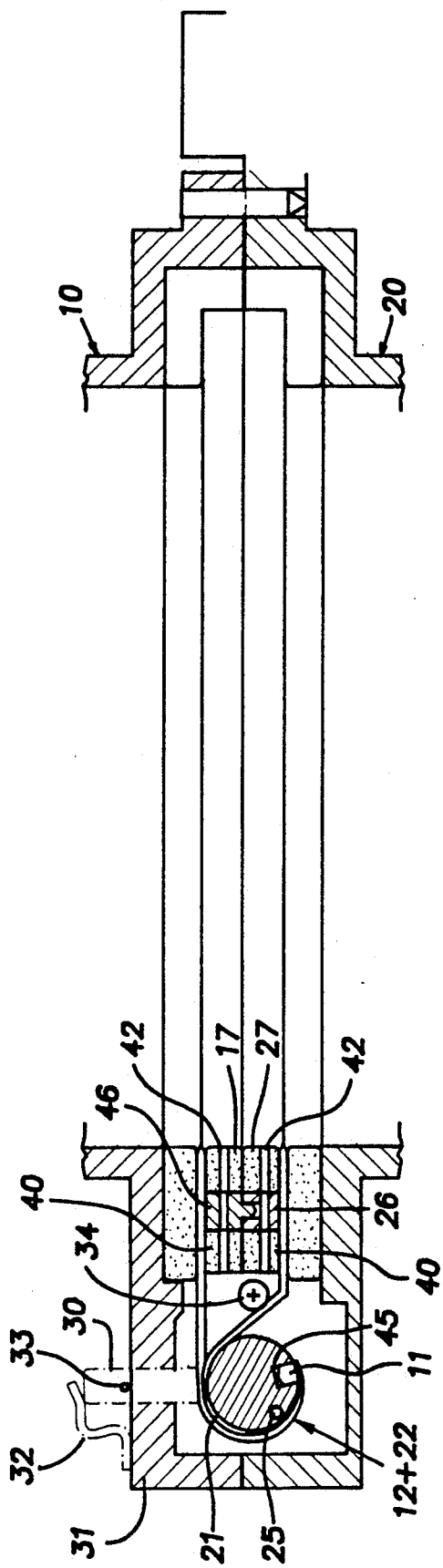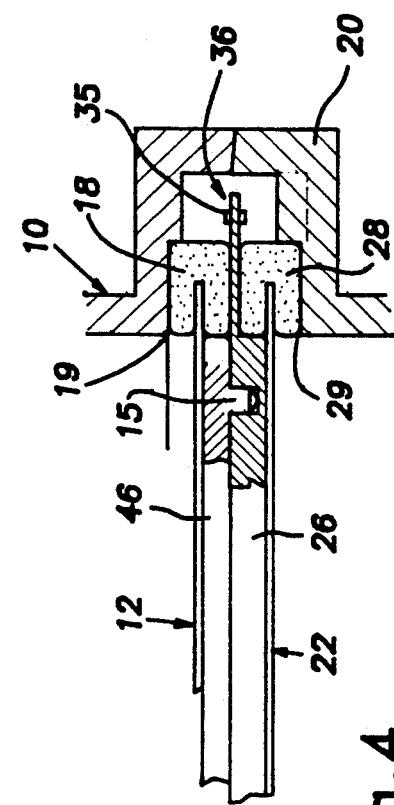

SYSTEM OF DOORS BETWEEN TWO MOBILE CONTAINERS, PARTICULARLY TWO ULTRACLEAN CONTAINERS

This is a continuation-in-part of application Ser. No. 07/755,691, filed Sep. 6, 1991, now abandoned.

BACKGROUND OF THE INVENTION

1. Field of the Invention

The present invention relates to the field of working and transporting objects in ultraclean atmospheres. It more particularly relates to the microelectronics industry.

2. Description of Related Art

In certain industries, such as microelectronics, some operations such as the preparation of silicon wafers must be carried out in a substantially impurity or dust-free atmosphere, i.e. in so-called white rooms. This is obtained by ventilating the rooms with air which has been filtered by absolute filters, i.e. those stopping even the finest dust.

It is also possible to transport or store silicon wafers in containers within which there is such an ultraclean atmosphere without the atmosphere of the rooms in which the containers are located being ultraclean. Therefore, these containers must be tight with respect to the dust in the said rooms.

Moreover, it is often necessary to transfer one or more silicon wafers between individual containers, e.g. from a storage container to a transportation container. The opening of the doors of the containers and the passage of the object from one container to the other cause problems of sealing with respect to the ultraclean atmosphere. Part of the problem could be solved by coupling together the two ultraclean containers prior to the opening of the two doors. However, like all the outer faces of the containers, the door has previously been in contact with the atmosphere prevailing in the room. Therefore, the coupling together of the two containers involves confining within the ultraclean volume defined by the interior of the two containers of the door and its polluted outer face.

The aim of the invention is to obviate this disadvantage by proposing a system of coupling together the two containers and opening the container doors without polluting the two containers by the outer face of the two doors.

SUMMARY OF THE INVENTION

The invention therefore mainly relates to a system of doors between two containers, each closed by a door and which can move relative to one another and which can be coupled together in order to interlink their respective internal volume, the two doors facing one another and being simultaneously retractable, the system comprising connecting and sealing means between the two containers, temporary connecting and sealing means between each door and its respective container, connecting and sealing means between the two doors, placed on the periphery of said two doors, in contact with the connecting and sealing means between the two containers, so that during the joining of the two containers and the two doors, the medium in contact with the outer parts of the two doors is confined between the two doors and cannot come into contact with the medium within the two volumes.

According to the invention, the two doors are curtains made from a flexible material and which wind into one another during retraction, in such a way that the outer faces of the two doors face one another and the inner faces of the two doors also face one another.

This is advantageously completed by the fact that one of the two containers is active and is equipped with means for rotating about an axis of one of the two doors and means for attaching the second door of the second container, which is passive, to the first door of the first container which is active.

According to this embodiment, the opening and closing of the doors takes place via rotating means comprising a roller mounted in rotary manner on one side of the active container and to which is fixed the curtain of said same active container, a spiral spring for bringing the roller into a first initial wound position and two cables for unwinding the two curtains into an unwound position, the two ends of the two doors having means for engaging one in the other.

Preferably, the means for sealing the two curtains relative to their respective container are constituted by two lateral carriages on each door between which the curtains slide and two transverse joints, each mounted on a lateral crossmember of one of the curtains and engaging in one another and the rotating means of the drum comprising a chamfered rod limiting the curtain of the passive container and which are fixed in a longitudinal drive recess of the roller of the active container.

Preferably, each of the two cables is fixed to one end of the cross-members outside the lateral carriages, but within the container in which they are located.

In order to facilitate sealing within the containers, the latter are equipped with means for connecting to a pressurized ultraclean air source.

The invention is described in greater detail hereinafter relative to non-limitative embodiments.

BRIEF DESCRIPTION OF THE DRAWINGS

The description is accompanied by various drawings, wherein show:

FIG. 3 is diagram identical to that of FIG. 2, but with the doors open.

FIG. 4 is a first partial diagram of the side corresponding to that of FIG. 3.

DETAILED DESCRIPTION OF THE PREFERRED EMBODIMENT

Figure 1A:
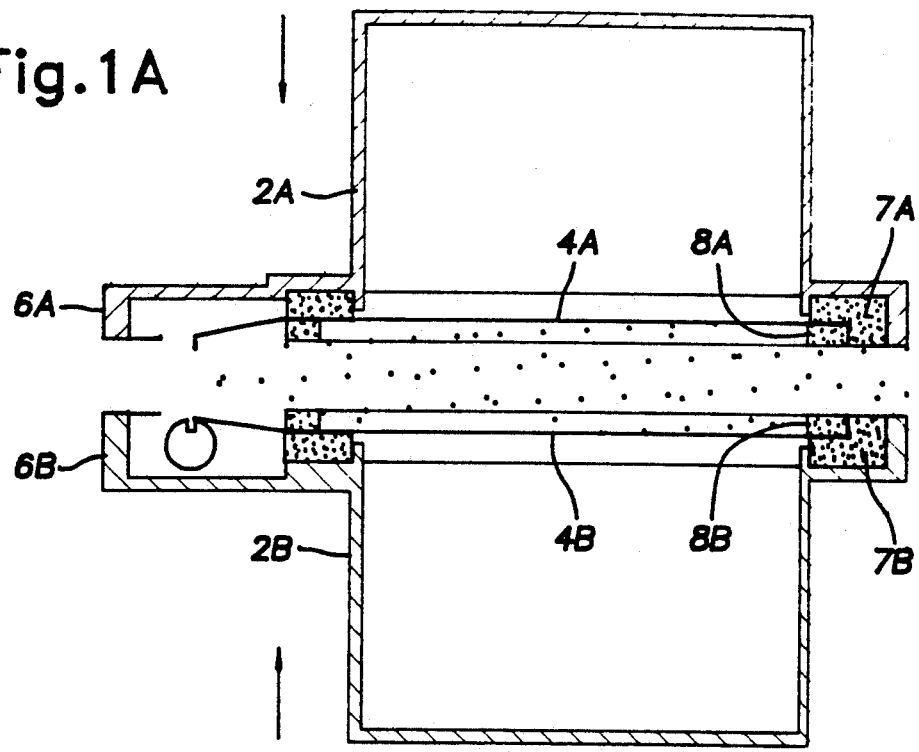
FIGS. 1A and 1B are two diagrams relative to the principle of the system according to the invention.

FIG. 1A shows two internal volumes each symbolized by a container 2A and 2B. Each of these two volumes is closed by a door 4A,4B. First connecting and sealing means 6A,6B are provided on each of the two containers 2A,2B. The two doors 4A,4B are sealed by second temporary connecting and sealing means symbolized by joints or gaskets 7A,7B placed between the doors 4A,4B and the containers 2A,2B. The two containers are shown separated in a varyingly polluted atmosphere.

Figure 1B:
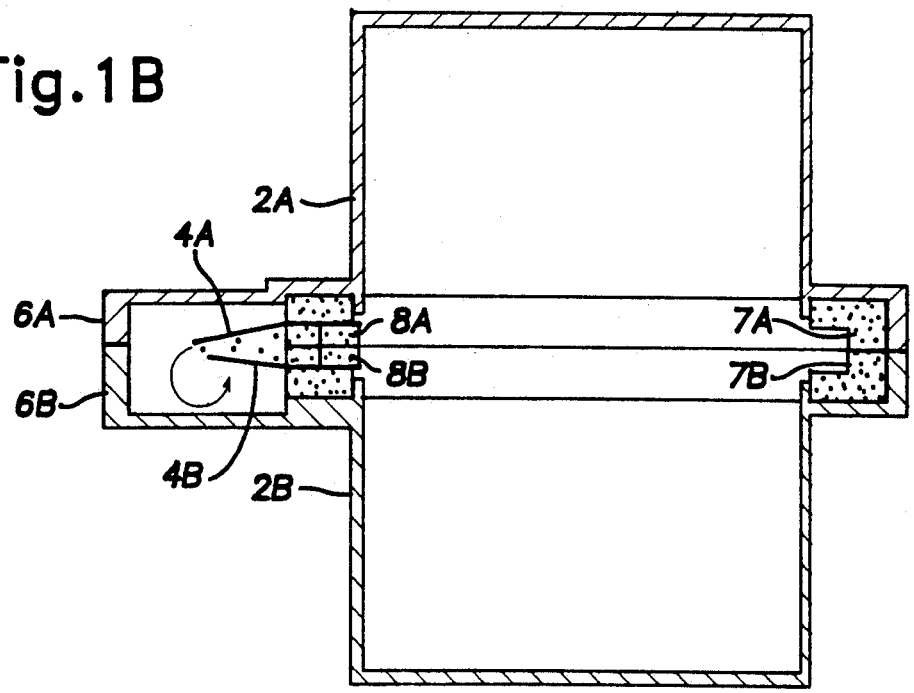

On considering FIG. 1B, the two containers 2A,2B are placed against one another. The first connecting and sealing means 6A,6B are positioned facing one another to ensure the connection and sealing between the two containers 2A,2B. The two doors 4A,4B face one another. The interior of each container 2A,2B still contains the atmosphere which prevailed before joining the two containers 2A,2B. However, through the joining of the two containers 2A,2B a small volume or at least particles from the atmosphere prevailing outside the two containers 2A,2B is trapped between the two doors 4A,4B.

Each of the two doors has third connecting and sealing means 8A,8B, so that these two doors 4A,4B are fixed tightly to one another, so as to tightly isolate the external atmosphere particles. These connecting and sealing means 8A,8B are symbolized by joints or gaskets over the entire periphery of the two doors 4A,4B.

Once the two containers 2A,2B are fixed tightly to one another and the two doors 4A,4B are also fixed tightly together, so as to trap the external atmosphere, it is possible to open the same. For this purpose, their third connecting and sealing means 8A,8B are disengaged from their second connecting and sealing means 7A,7B of the two containers 2A,2B, as represented by the vertical or wound positions of the two doors 4A,4B, shown in dot-dash line form. One or more objects can then be transferred from one container to the other, the two containers 2A,2B remaining hermetically coupled together.

The following drawings relate to the application of the principle according to the invention to ultraclean containers, but other applications are also possible.

Figure 2:
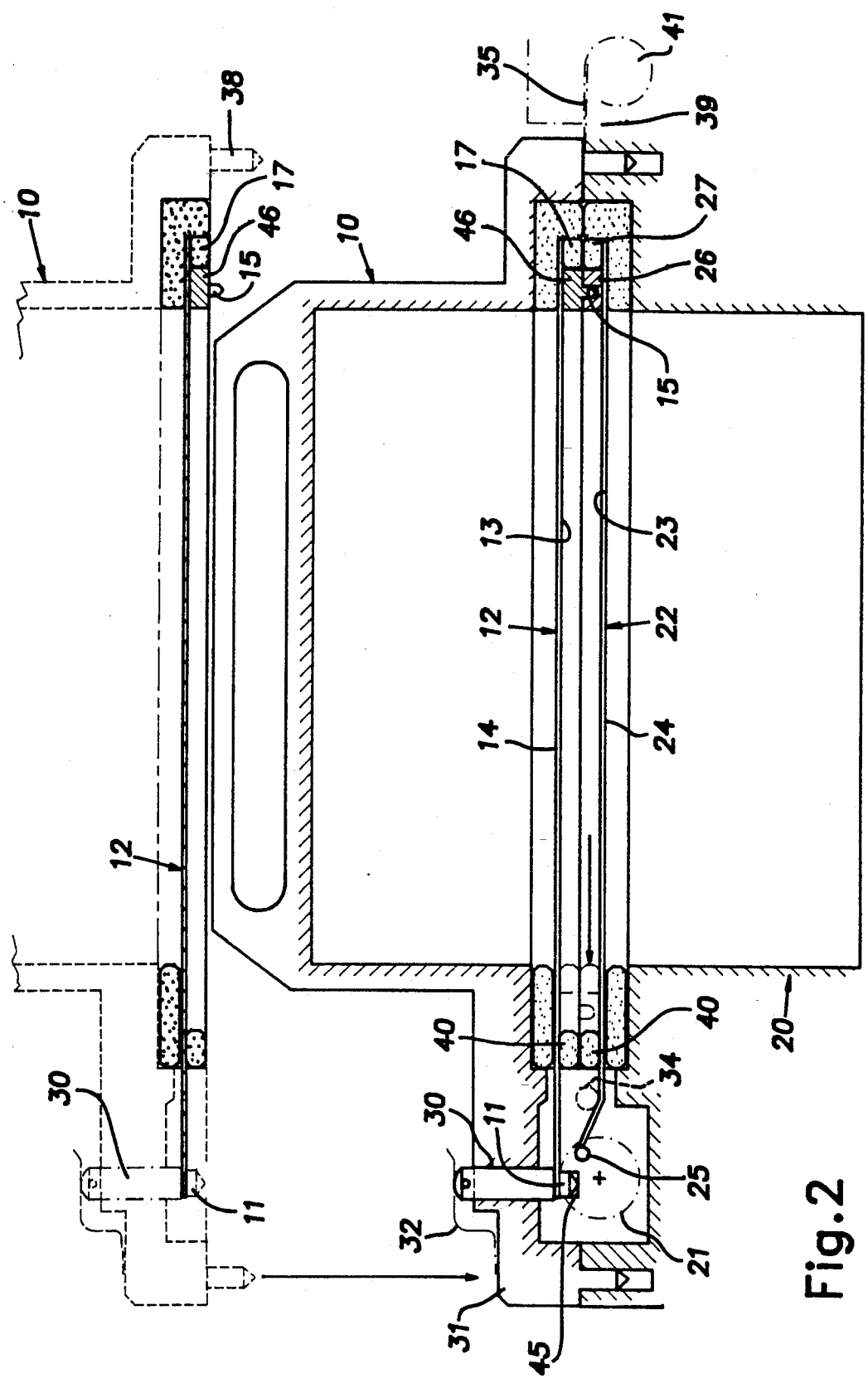
FIG. 2 is a plan view of the two containers in the application of the invention to ultraclean containers, the doors being closed.

According to the invention and as shown in FIG. 2, the doors are flexible and in the form of curtains 12,22. The putting into effect of the principle referred to hereinbefore mainly takes place with the aid of a roller 21 around which are wound the two curtains 12,22. Thus, once the two containers 10,20 have been engaged, the two curtains 12 and 22 are positioned facing one another, their flexibility then making it possible to wind one within the other around the drum 21. Once this operation has been completed, the two continuous spaces within the two containers 10,20 are linked with one another. Thus, the outer faces 13,23 face one another once the two curtains 12 and 22 are wound in one another. In the same way, the faces 14,24 opposite to the outer faces will then be against one another after winding.

The third connecting and sealing means between the two curtains 12,22 are constituted by a longitudinal groove 45, identical to a key groove formed along the drum 21 with respect to the container 20 carrying the drum 21 and referred to as the active container. The curtain 22 of said active container 20 is fixed by one of its sides to the drum 21. With respect to the facing passive container 10, a curtain rod 11 is placed facing the longitudinal groove 45 during the engagement of the two containers 10,20. It penetrates the interior of the longitudinal groove 45. It is also integral with the curtain 12 of the passive container 10. Thus, when introduced into the longitudinal groove, the curtain 12 will be rotated when the drum 21 is rotated. These third connecting and sealing means are completed by a retaining ring 25 fixed to one end of the curtain 22 of the active container 20 and fixed to the drum 21 in order to rotate the curtain 22. At the two other ends of the curtains 12,22, said means are completed by a longitudinal pin 15 of a crossmember 46 of the curtain 12 inserted in a lateral crossmember 26 of the curtain 22 of the active container 20. A set of joints or gaskets 17,27 advantageously completes these three sealing means.

FIG. 4 shows the sealing means between the curtains 12 and 22 and their respective container 10 and 20. For this purpose, the two other sides of the curtains 12,22, i.e. the sides perpendicular to the drum 21 and to the lateral crossmember 26 are also provided with lateral joints 18,28 respectively placed on the passive container 10 and the active container 20. More specifically, these two lateral joints 18,28 are inserted in the recesses 19 and 29 of the walls of the two containers 10 and 20. A small space is provided in such a way that the curtains can be inserted between the lateral carriages 18 and 28 of the recesses 19 and 29.

FIG. 2 shows the two containers 10 and 20 in the engaged state, the curtains 12 and 22 still being in the closed position, i.e. the respective ultraclean atmospheres of the two containers 10 and 20 are still not mixed.

With reference to FIG. 3, following the opening of the two curtains 12 and 22, the latter are wound around the drum 21. It should be noted in this connection that the curtains 12 and 22 should have a minimum thickness. Thus, during the engagement of the two containers 10 and 20, the ends of the two curtains 12,22 are fixed in pairs. However, when winding the two curtains 12 and 22, one of the curtains is always above the other and consequently has a slightly greater theoretical wound length than that of the other. This phenomenon is minimized by choosing a material of the Mylar type, whose thickness is very small and permits a slight elasticity over the entire curtain length.

With reference to FIG. 2, the curtain 12 of the passive container 10 is kept closed by the fact that the chamfered curtain rod 11 is kept in the drum 21 by a magnet 30 mounted in sliding manner in a support 31, constituted by the passive container 10, on which bears a plate spring 32. Thus, the chamfered curtain rod 11 is kept in the longitudinal slot of the drum 21. During opening, as the two curtains 12,22 are wound around the drum 21, the thickness of the curtains around the latter increases and the magnet 30 moves back by a few millimeters. This magnets 30 is stopped in translation towards the drum 21 by a transverse pin 33. During opening, the chamfered rod 11 is disengaged from the magnet 30.

A detour roller 34 can be placed alongside the drum 21 so as to keep the door 22 of the active container 20 far enough away from the door 12 of the passive container 10.

Figure 5:
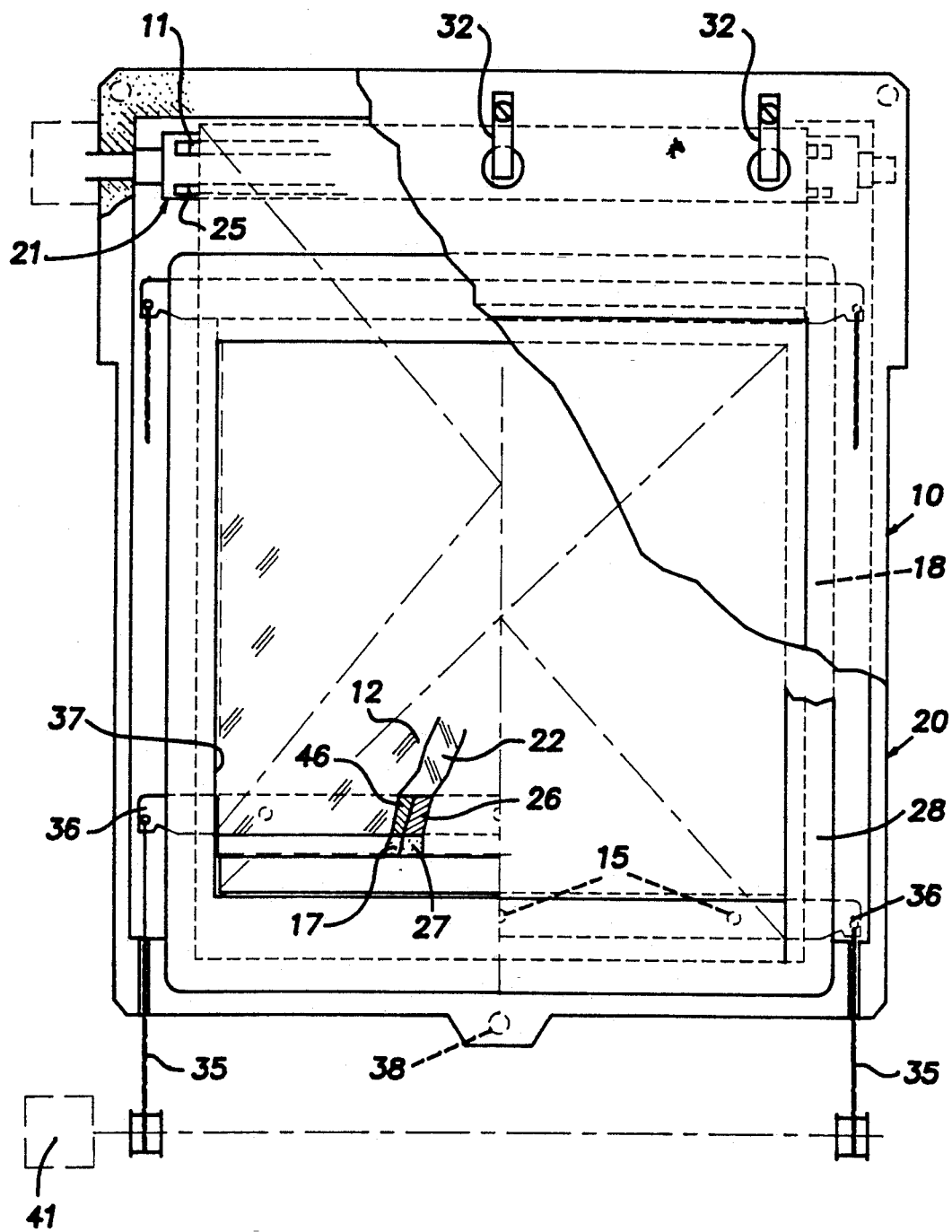
FIG. 5 is a frontal diagram showing the opening system according to the invention in its use for ultraclean containers.

In order to close the two curtains 12,22, the system comprises two cables 35, each fixed to one end 36 of the lateral crossmember 26 of the curtain 22 of the active container 20. Thus, as shown in FIG. 5, each end 36 of the lateral crossmember 26 projects beyond the lateral carriages or gaskets 18,28. Thus, each cable 35 is fixed outside the volume kept under an ultraclean atmosphere. Therefore, the cables 35 can traverse the containers 10,20 by an opening 37 without there being any need to take special measures relative to the sealing at the opening 37. The air or medium between the two curtains 12,22 can leak out, as the doors are opened, by small apertures 42 through parts 17, 46 and 40, and parts 27, 26 and 40, in FIG. 3. An alternative is to have only one such aperture. Thus such trapped air or medium escapes to the outside air, through the small apertures 42, rather than to the space within the containers 10,20. With reference to FIG. 2, the reciprocal positioning of the containers preferably takes place by at least one positioning pin 38 for the passive container 10 being able to enter a hole in a positioning crossmember 39 projecting to the outside of the active container 20. On one side, the chamfered rod 11 is introduced into the longitudinal slot of the drum 21 and on the other the centering pins 15 are introduced into the lateral crossmember 26 and the two baffle-type joints 17,27 are engaged in one another. Opening can then take place. The drum 21 is rotated by a motor or a not shown spiral spring and the curtain 12 of the passive container slides laterally beneath the magnet 30, which progressively rises as the diameter increases with the extra thicknesses of curtains 12 and 22. The springs 32 exert a take-up pressure on the magnets 30. At the end of travel, i.e. when the curtains 12,22 are completely open, the two lateral crossmembers 26,46 abut against an abutment crossmember 40 placed on the passive container level with the detour roller 34. This abutment crossmember 40 can, advantageously with respect to the overall sealing, be constituted by sealing joints or gaskets identical to the lateral joints 18,28.

In order to carry out closing, it is merely necessary to simultaneously pull on the two cables 35. This tension leads to the simultaneous translation of the two curtains 12,22. A motor 41 can be provided outside the active container 20.

The essential interest of the device is in the winding of the two curtains 12,22 in the same direction, the two clean faces facing one another and the two unclean or more or less polluted faces also facing one another.

The present invention has been described with the aid of its application to two ultraclean containers. However, this only constitutes an example. The notion of volumes closed in each case by a door in accordance with the principle given relative to FIGS. 1A and 1B forming the basis for the concept of the invention. Moreover, the concept of winding the two doors in the form of curtains can be put into effect differently.

We claim:

1. A system of doors between first and second containers (10,20), said first and second containers (10,20) being closable by first and second doors (4A,4B,12,22), respectively, and being movable relative to one another, said containers (10,20) including coupling means to interlink their respective internal volumes, said coupling means including said first and second doors (4A,4B,12,22), said first door facing said second door and being simultaneously retractable therewith, the coupling means comprising connecting and sealing means mounted on each container and adapted to seal between the two containers (10,20), temporary connecting and sealing means mounted on each container and adapted to seal between each door (4A,4B,12,22) and its respective container (10,20), and connecting and sealing means mounted on each door and adapted to seal between the two doors (4A,4B,12,22), said connecting and sealing means between the two doors being placed on the periphery of said doors (4A,4B,12,22) and being in contact with the connecting and sealing means between the two containers so that a medium in contact with the outer faces (13,23) of the doors (12,22) is confined between the doors and cannot contact a medium within the two volumes when the first and second containers (10,20) are being coupled together, wherein the two doors are curtains (12,22) made from a flexible material; and means mounted on one of the containers to wind the two door curtains—one into the other during retraction such that the outer faces (13,23) of the doors (12,22) face one another and the inner faces (14,24) of the doors (12,22) also face one another.

2. A system according to claim 1, wherein said second container (10) provides said winding means for rotating about an axis; and means on said second curtain for attaching the second curtain (22) to the winding means.

3. A system according to claim 2, wherein said winding means comprises a drum (21) rotatably mounted on one side of the second container (20) and to which is fixed the second curtain (22), a spiral spring connected to said drum for urging said drum (21) into an initial wound position to open the curtains; and two cables (35) connected to a motor and to at least one of the curtains for tensioning the spiral spring and unwinding the curtains (12,22) into an unwound position, the ends of the first and second curtains (12,22) incorporating mutual engagement means.

4. A system according to claim 3, wherein the sealing and connecting means of the two curtains (12,22) relative to their respective container (10,20) includes two lateral gaskets (18,28), each placed on a door and between which slide the curtains (12,22) and further includes two transverse joints (17,27), each mounted on a lateral cross-member (26,46) of one of the curtains (12,22) and engaging one another, as well as means for rotating the drum (21) includes a chamfered rod (11) connected to the first curtain (12) and being fixed in a longitudinal drive slot of the drum (21) of the first container (20).

5. A system according to claim 4, wherein the two cables (35) are in each case fixed to one end (36) of one of the lateral crossmembers (26) externally of the lateral gaskets (18,28) within the containers (10,20).

6. A system according to claim 1, wherein the two containers (10,20) are equipped with means for connecting to a pressurized ultraclean air source.

* * * * *